(12) United States Patent
Llewellyn

(10) Patent No.: US 8,638,148 B2
(45) Date of Patent: Jan. 28, 2014

(54) EDGE RATE CONTROL

(75) Inventor: William D. Llewellyn, San Jose, CA (US)

(73) Assignee: Fairchild Semiconductor Corporation, South Portland, ME (US)

(*) Notice: Subject to any disclaimer, the term of this patent is extended or adjusted under 35 U.S.C. 154(b) by 248 days.

(21) Appl. No.: 12/899,810

(22) Filed: Oct. 7, 2010

(65) Prior Publication Data

US 2011/0084746 A1   Apr. 14, 2011

Related U.S. Application Data

(60) Provisional application No. 61/249,593, filed on Oct. 7, 2009.

(51) Int. Cl.
*H03K 5/12* (2006.01)

(52) U.S. Cl.
USPC .......................................... 327/170; 327/172

(58) Field of Classification Search
None
See application file for complete search history.

(56) References Cited

U.S. PATENT DOCUMENTS

| 5,684,421 | A | * | 11/1997 | Chapman et al. | ............ 327/261 |
| 6,271,641 | B1 | * | 8/2001 | Yasohara et al. | ............ 318/685 |
| 7,378,878 | B2 | | 5/2008 | Major | |
| 7,449,913 | B1 | | 11/2008 | Hung | |
| RE41,926 | E | | 11/2010 | Lee | |
| 2005/0030078 | A1 | | 2/2005 | Ajit | |
| 2006/0238241 | A1 | * | 10/2006 | Pearce et al. | ................... 330/10 |
| 2010/0244907 | A1 | | 9/2010 | Gagne et al. | |
| 2012/0206191 | A1 | | 8/2012 | Llewellyn | |

FOREIGN PATENT DOCUMENTS

| CN | 1391350 A | 1/2003 |
| CN | 1529937 A | 9/2004 |
| CN | 101005273 A | 7/2007 |
| CN | 101416391 A | 4/2009 |
| CN | 102638253 A | 8/2012 |
| JP | 3937286 B2 | 6/2007 |
| KR | 1020110037923 A | 4/2011 |
| TW | 201136157 | 10/2011 |

OTHER PUBLICATIONS

"U.S. Appl. No. 13/177,019, Non Final Office Action mailed Apr. 3, 2013", 12 pgs.
"Chinese Application Serial No. 201010624491.9, Office Action mailed Aug. 30, 2013", 8 pgs.

* cited by examiner

*Primary Examiner* — Cassandra Cox
(74) *Attorney, Agent, or Firm* — Schwegman Lundberg & Woessner, P.A.

(57) ABSTRACT

This document discusses, among other things, a system and method for reducing electromagnetic interference of a switched signal. In an example, a switched input signal can be received at an input and a transition rate of an edge rate controlled, switched output signal can be controlled in response to the received switched input signal.

15 Claims, 9 Drawing Sheets

EDGE RATE CONTROL

CLAIM OF PRIORITY

The present application claims benefit under 35 U.S.C. 119(e) of Llewellyn U.S. Provisional Patent Application No. 61/249,593, entitled "EDGE RATE CONTROL," filed Oct. 7, 2009, which is hereby incorporated by reference herein in its entirety.

BACKGROUND

Generally, a varying signal passing through a conductor can generate, and radiate, electromagnetic energy. Conductors can generate current when subjected to varying electromagnetic energy. Currents generated in an electronic device from unanticipated electromagnetic energy can interfere with the desired operation of the electronic device. Unanticipated electromagnetic energy is sometime referred to as electromagnetic interference (EMI). Standards have been formulated to encourage electronic device manufacturers to design products that limit the amount of EMI each product emits. Such standards, in turn, assist in providing minimum specifications for EMI a product should be able to withstand under normal operating conditions. Switched signals are often associated with generating a significant amount of EMI. In some devices, the faster a switched signal transitions from a first state to a second state, the stronger the radiated EMI.

OVERVIEW

This document discusses, among other things, a system and method for reducing electromagnetic interference of a switched signal. In an example, a switched input signal can be received at an input and a transition rate of an edge rate controlled, switched output signal can be controlled in response to the received switched input signal. In an example, a controller can receive the switched input signal and can use an integrator to generate an edge rate controlled version of the received switched input signal.

In Example 1, an apparatus for reducing electro-magnetic interference includes an input configured to receive a switched input signal, an output configured to provide an edge rate controlled, switched output signal corresponding to the received switched input signal, and a controller responsive to the received switched input signal. The controller includes an integrating amplifier configured to control a transition rate of the edge rate controlled, switched output signal between first and second signal levels.

In Example 2, the integrating amplifier of Example 1 optionally includes an amplifier having a first input node and an output node coupled to the output, and a first capacitor coupled between the first input node and the output node of the amplifier.

In Example 3, the controller of any one or more of Examples 1-2 optionally includes a first selection circuit configured to selectively couple first and second current sources to the first input node of the amplifier to set the transition rate of the edge rate controlled, switched output signal between the first and second signal levels.

In Example 4, the first amplifier of any one or more of Examples 1-3 optionally includes complementary first and second output transistors coupled in series between a supply node and a reference node, the output node of any one or more of Examples 1-3 optionally includes a node configured to couple the first output transistor in series with the second output transistor.

In Example 5, the amplifier of any one or more of Examples 1-4 optionally includes first and second buffers configured to isolate a capacitance of the first and second output transistors from the input node, wherein the first buffer is coupled between the first input node and a control node of the first output transistor, and wherein the second buffer is coupled between the first input node and a control node of the second output transistor.

In Example 6, any one or more of Examples 1-5 optionally includes a level shifter coupled between an input of the first buffer and an input of the second buffer.

In Example 7, the amplifier of any one or more of Examples 1-6 optionally includes a second input node coupled to the input of the second buffer, wherein the integrating amplifier of any one or more of Examples 1-6 optionally includes a second capacitor coupled between the second input node and the output node of the amplifier, and wherein the controller of any one or more of Examples 1-6 optionally includes a second selection circuit configured to selectively couple third and fourth current sources to the second input node of the amplifier to set the transition rate of the edge rate controlled, switched signal between the first and second signal levels.

In Example 8, any one or more of Examples 1-7 optionally includes a delay circuit coupled to the output and configured to provide a delay control signal, a first bypass switch configured to couple the output to a first reference voltage using the delay control signal, and a second bypass switch configured to couple the output to a second reference voltage using the delay control signal.

In Example 9, any one or more of Examples 1-8 optionally includes a voltage tie-off circuit configured to reduce a response time of the integrating amplifier in response to a transition of the received switched input signal between first and second signal levels. The voltage tie-off circuit includes a first voltage source selectively coupled to the first input node when the output is at a first signal level, and a second voltage source selectively coupled to the first input node when the output is at a second signal level.

In Example 10, any one or more of Examples 1-9 optionally includes a delay circuit coupled to the output and configured to provide a delay control signal, a first bypass switch configured to couple the output to a first reference voltage using the delay control signal, and a second bypass switch configured to couple the output to a second reference voltage using the delay control signal.

In Example 11, the delay circuit of any one or more of Examples 1-10 optionally includes a comparator configured to detect an output signal level between the first signal level and the second signal level, and a delay element coupled to an output of the comparator and configured to switch the delay control signal a predetermined delay interval after the comparator detects the output signal level between the first signal level and the second signal level.

In Example 12, the comparator of any one or more of Examples 1-11 is optionally configured to detect an output signal level substantially midway between the first signal level and the second signal level.

In Example 13, the predetermined delay interval of any one or more of Examples 1-12 is optionally about 10 nanoseconds.

In Example 14, any one or more of Examples 1-13 optionally includes an overshoot limiter coupled to the output and optionally configured to exchange current with a load coupled to the output to reduce voltage overshoot as a voltage of the output reaches the first and second signal levels.

In Example 15, a method for reducing electro-magnetic interference includes receiving a switched input signal at an input, controlling a transition rate of an edge rate controlled, switched output signal in response to the received switched input signal, providing the edge rate controlled, switched output signal at an output, and wherein the controlling the transition rate includes controlling the transition rate of the edge rate controlled, switched output signal between first and second signal levels using an integrating amplifier.

In Example 16, the controlling the transition rate of any one or more of Examples 1-15 includes coupling a first current source to a first input of the integrating amplifier to generate a first transition from the first signal level to the second signal level over a predetermined interval in response to a first transition of the received switched signal.

In Example 17, the controlling the transition rate of any one or more of Examples 1-16 optionally includes coupling a second current source to a first input of the integrating amplifier to generate a second transition from the second signal level to the first signal level over the predetermined interval in response to a second transition of the received switched signal.

In example 18, the controlling the transition rate of any one or more of Examples 1-18 optionally includes coupling a third current source to a second input of the integrating amplifier to generate a first transition from the first signal level to the second signal level over a predetermined interval in response to a first transition of the received switched signal, and coupling a fourth current source to the second input of the integrating amplifier to generate a second transition from the second signal level to the first signal level over the predetermined interval in response to a second transition of the received switched signal.

In Example 19, any one or more of Examples 1-18 optionally includes selectively coupling the output to a first voltage source after a transition from the second signal level to the first signal level, and selectively coupling the output to a second voltage source after a transition from the first signal level to the second signal level.

In Example 20, the controlling the transition rate of any one or more of Examples 1-19 optionally includes detecting an signal level of the output between the first signal level and the second signal level using a comparator coupled to the output, initiating a delay using a delay element coupled to the comparator, selectively coupling the output to at least one of a first or second voltage source in response to an expiration of the delay, and disabling the integrating amplifier.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by the machine, cause the machine to perform any one or more of the functions of Examples 1-20.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized that controlling the transition rate, or the edge rate, of a switched signal can allow control of EMI emissions generated from conductors carrying the switched signal.

Figure 1:
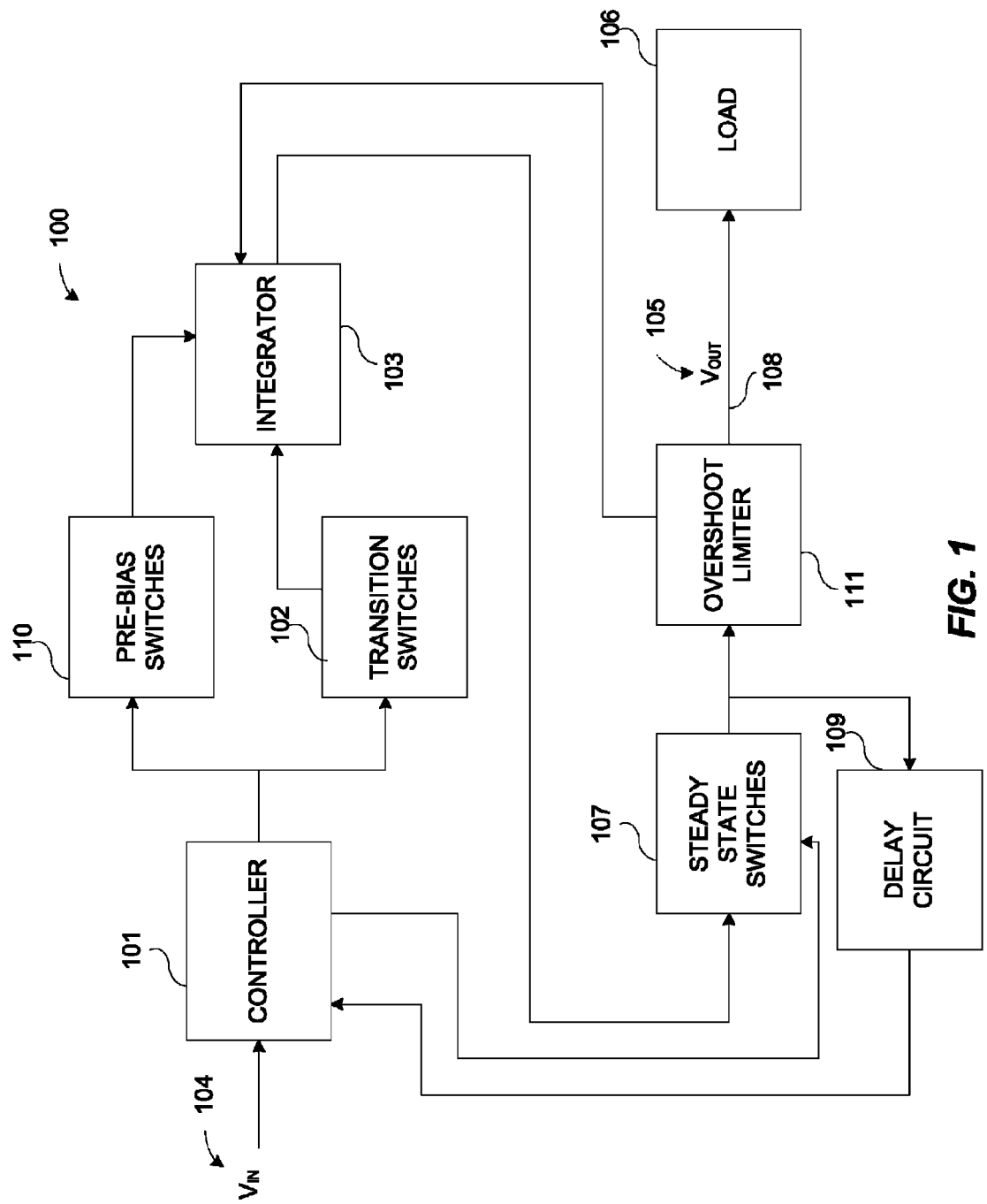
FIG. 1 illustrates generally a block diagram example of an edge rate control apparatus configured to control an edge rate of an output signal responsive to a switched input signal.

FIG. 1 illustrates generally a block diagram example of an edge rate control apparatus 100 configured to control an edge rate of an edge rate controlled, output signal ($V_{OUT}$) 105 responsive to a switched input signal ($V_{IN}$) 104. The edge rate control apparatus 100 can include a controller 101, transition switches 102, and an integrator 103 configured to provide the edge rate controlled, output signal ($V_{OUT}$) 105 representative of a switched input signal ($V_{IN}$) 104 (e.g., a switched input signal) to a load 106. In certain examples, the switched input signal 104 represents an audio signal, such as a switched audio signal from a Class-D amplifier, and the load 106 can include an audio output transducer, such as a speaker or ear phone, for example. It is understood that the switched input signal 104 can include other types of switched signals other than audio switched signals without departing from the scope of the present subject matter.

Many switched input signals can be coupled directly to a load in electronic devices and function as desired. However, today's electronics are capable of very fast switching that can generate a significant amount of EMI as the signal is transmitted through conductors coupling the signal to the load. In an example, the edge rate control apparatus 100 can generate, as the output signal 105, a representation of the switched input signal 104. The controller 101 can control the transition rate of the representative edge rate controlled, output signal 105 as it changes steady state levels, while, for example, at the same time, the edge rate control apparatus 100 does not change the underlying steady state frequencies of the switched input signal 104.

In general, the controller 101 can monitor the switched input signal 104. As the switched input signal 104 changes states, the controller 101 can control transition switches 102 to enable the integrator 103. The integrator, in cooperation with the transition switches 102, can control the transition rate of the output signal 105 between states. The integrator 103 can generate an edge rate controlled, output signal 105 representative of the switched input signal 104. In some examples, selection of integrator components can determine the transition rate of the output signal 105. In other examples, selection of the transition switch components can determine the transition rate of the edge rate controlled, output signal 105.

In some examples, an edge rate control apparatus 100 can optionally include steady state switches 107 (e.g. bypass switches) to couple an output 108 of the edge rate control apparatus 100 to at least one steady state voltage when the edge rate controlled, output signal 105 has completed a transition and the switched input signal 104 is between transitions. In various examples, an optional delay circuit 109 can monitor the transition of the edge rate controlled, output signal 105 and can trigger control of the steady state switches 107 as the edge rate controlled, output signal 105 reaches a steady state level. In an example, the controller 101 can disable the integrator 103 during steady state periods between transitions of the switched input signal 104 to conserve power consumption. In an example, optional pre-bias switches 110 (e.g., pre-bias voltage tie-offs) can precondition a state of the integrator 103 in anticipation of a transition of the switched input signal 104 such that transitions of the edge rate controlled, output signal 105 can be more quickly initiated. In an example, an optional overshoot limiter 111 can be used to control overshoot of the edge rate controlled, output signal 105 as it approaches a steady state level. In applications where the load 106 includes an inductor, current flow through the inductor can strongly resist change as the edge rate controlled, output signal 105 approaches a steady state signal level. If the inductance is large enough, the voltage can continue significantly past the intended steady state voltage level until the current flow can be modified. The optional overshoot limiter 111 can sense an overshoot voltage condition and can drive the integrator 103 to supply or sink additional current to quickly suppress the overshoot condition.

FIGS. 2-6 and the following discussion provide additional examples of an edge rate control apparatus including optional components thereof.

Figure 2:
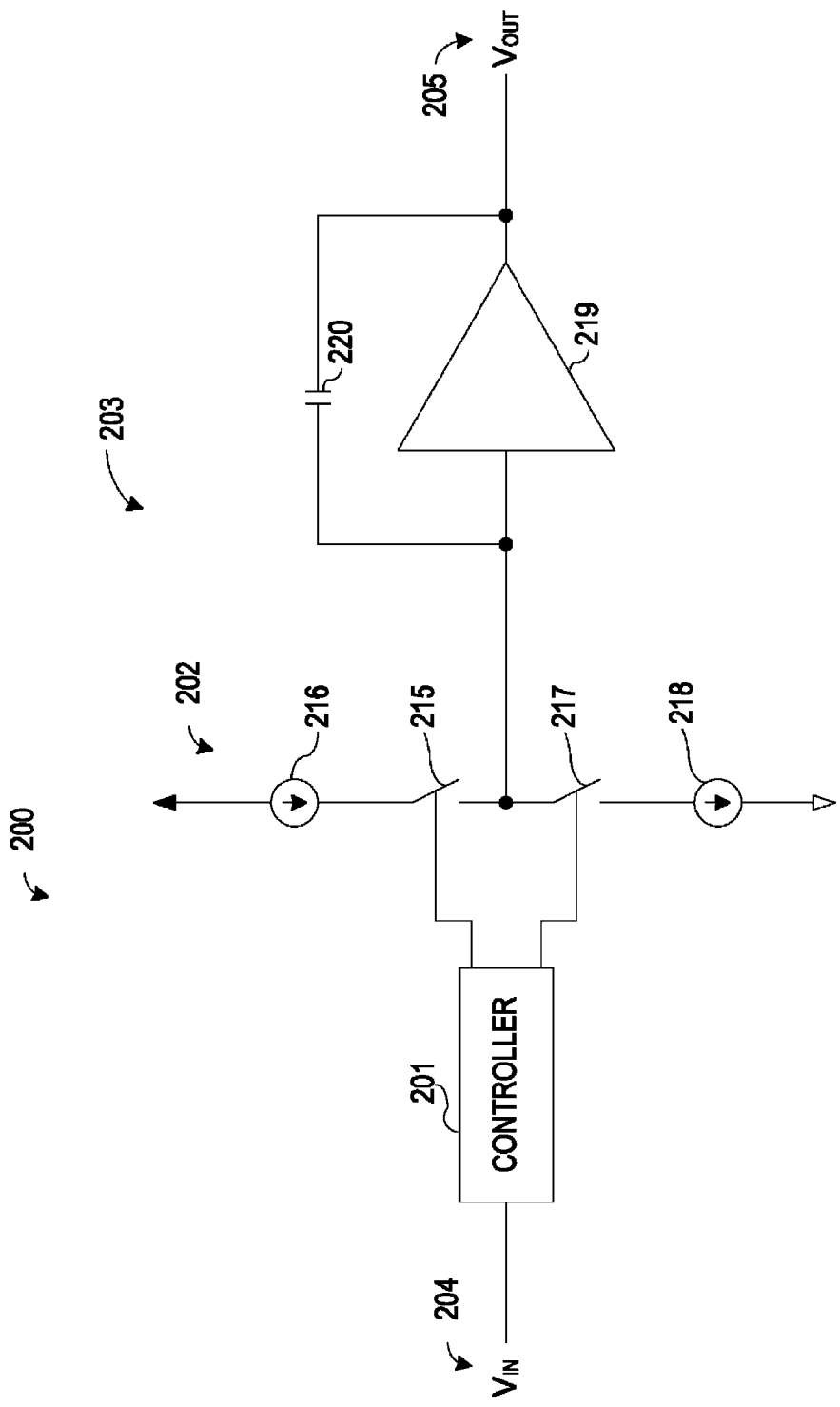
FIGS. 2-7 illustrate generally examples of an edge rate control apparatus.

FIG. 2 illustrates generally an example of an edge rate control apparatus 200 including a controller 201 configured to receive a switched input signal ($V_{IN}$) 204, transition switches 202 configured to initiate rate control of the edge rate controlled, output signal 205 transitions in response to transitions of the switched input signal 204, and an integrator 203 configured to control the transition rate of the edge rate controlled, output signal 205.

In an example, the transition switches 202 can include a first switch 215 and a first current source 216 configured to initiate a first transition of the edge rate controlled, output signal 205, such as a transition from a higher voltage state to a lower voltage state. In an example, the transition switches 202 can include a second switch 217 and a second current source 218 configured to initiate a second transition of the edge rate controlled, output signal 205, such as a transition from a lower voltage state to a higher voltage state. In certain examples, the controller 201 can control the first and second switches 215, 217 in response to the switched input signal 204. In an example, the integrator 203 can include an amplifier 219 and a feedback coupled capacitor 220. Selection of one or more of the current sources, amplifier gain, or capacitor can determine, to a significant level, the transition rate of the edge rate controlled, output signal 205. In an example, selection of 300 micro-amp (μA) current sources for the first and second current sources 216, 218 and a 1 picofared (pf) capacitor 220 can provide a 20 nanosecond transition between 0 and 6 volts of the edge rate controlled, output signal 205.

Figure 3:
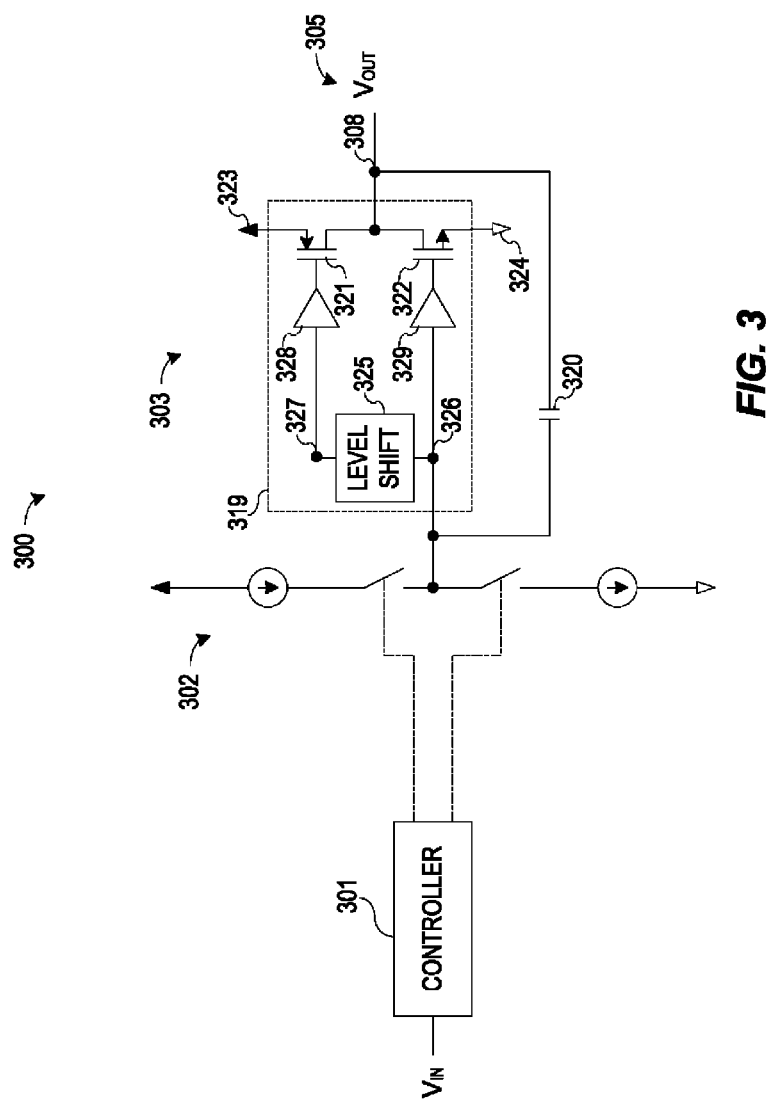

FIG. 3 illustrates generally an example of an edge rate control apparatus 300 including a controller 301, transition switches 302, and an integrator 303. The integrator 303 can include an amplifier 319, for example, an inverting amplifier, and a capacitor 320. The amplifier 319 can include a complementary pair of output transistors 321, 322. The output transistors 321, 322 can be configured to pull the output 308 to a respective voltage rail 323, 324 (e.g., logic high, logic low, etc.). In certain examples, a control node of each output transistor 321, 322 can be biased using set of transition switches 302. In certain examples, a level shift circuit 325 can distribute a summing node 326 of the integrator 303, and can provide a constant bias between the summing nodes 326, 327 to compensate for different threshold voltages ($V_{th}$) of the output transistors 321, 322. In certain examples, buffers 328, 329 can be coupled between the distributed summing nodes 326, 327 of the integrator 303 and the output transistors 321, 322 to isolate input capacitance of the control nodes of the output transistors 321, 322 from the distributed summing nodes 326, 327. For example, large output transistors 321, 322 can be used to provide a high-powered, edge rate controlled, output signal 305. Larger output transistors 321, 322 can include higher capacitance control nodes. Thus, the buffers 328, 329 can isolate the capacitance of the control nodes of the output transistors 321, 322 from the summing nodes 326, 327 of the integrator 303. In an example, the first output transistor 321 can include a PMOS transistor and the second output transistor 322 can include an NMOS transistor. It is understood that other types operation amplifiers are possible to operate in the example circuits including, but not limited to, other amplifiers having different types of output transistors, without departing from the scope of the present subject matter.

Figure 4:
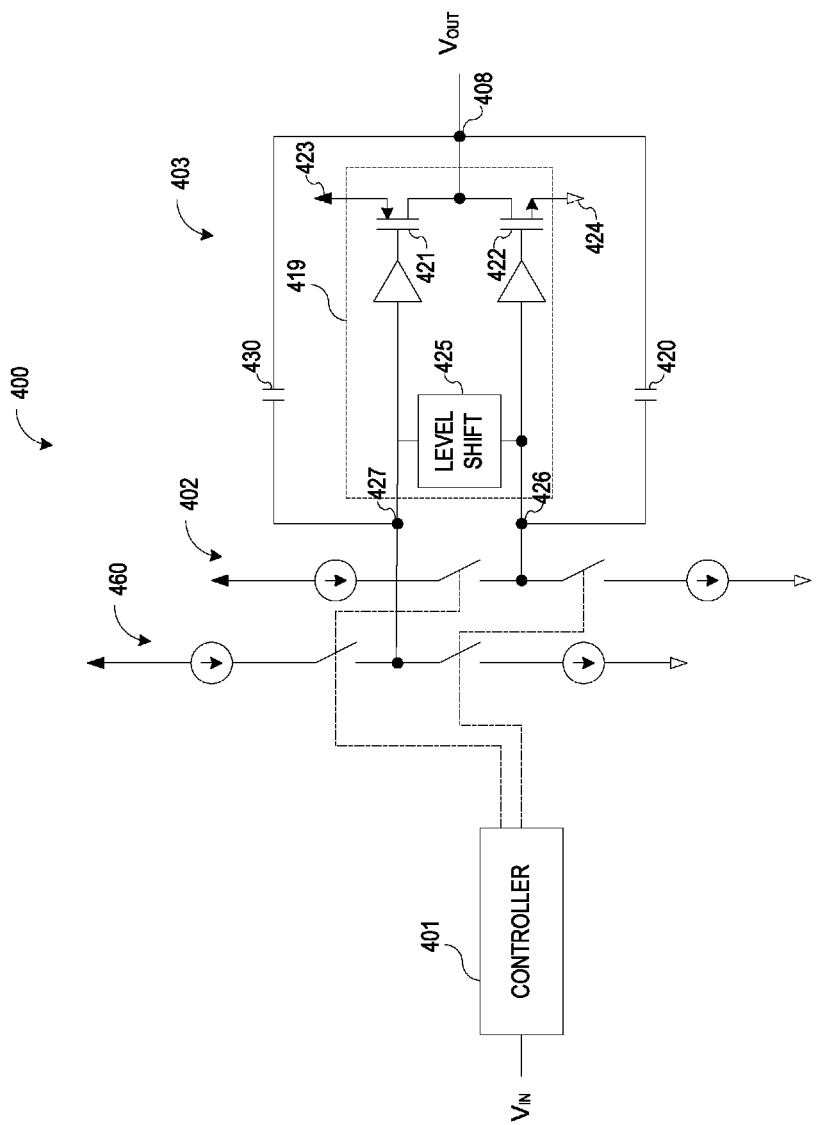

FIG. 4 illustrates generally an example of an edge rate control apparatus 400 including a controller 401, transition switches 402, 460, and an integrator 403. The integrator 403 can include an amplifier 419, feedback capacitors 420, 430, and, in certain examples, a complementary pair of output transistors 421, 422. The output transistors 421, 422 can be configured to pull the output ($V_{OUT}$) 408 to a respective voltage rail 423, 424 (e.g., logic high, logic low, etc.). In the example of FIG. 4, the amplifier 419 can be divided to provide two input/summing nodes 426, 427. The feedback loop of the amplifier 419 can also be divided and can include a first feedback capacitor 420 coupled to the first input node 426 and a second feedback capacitor 430 coupled to a second input node 427. In certain examples, each control node of each output transistor 421, 422 can be biased using a separate set of transition switches 402, 460. In such a configuration, the level shift circuit 425 can be balanced and energy can be conserved.

Figure 5:
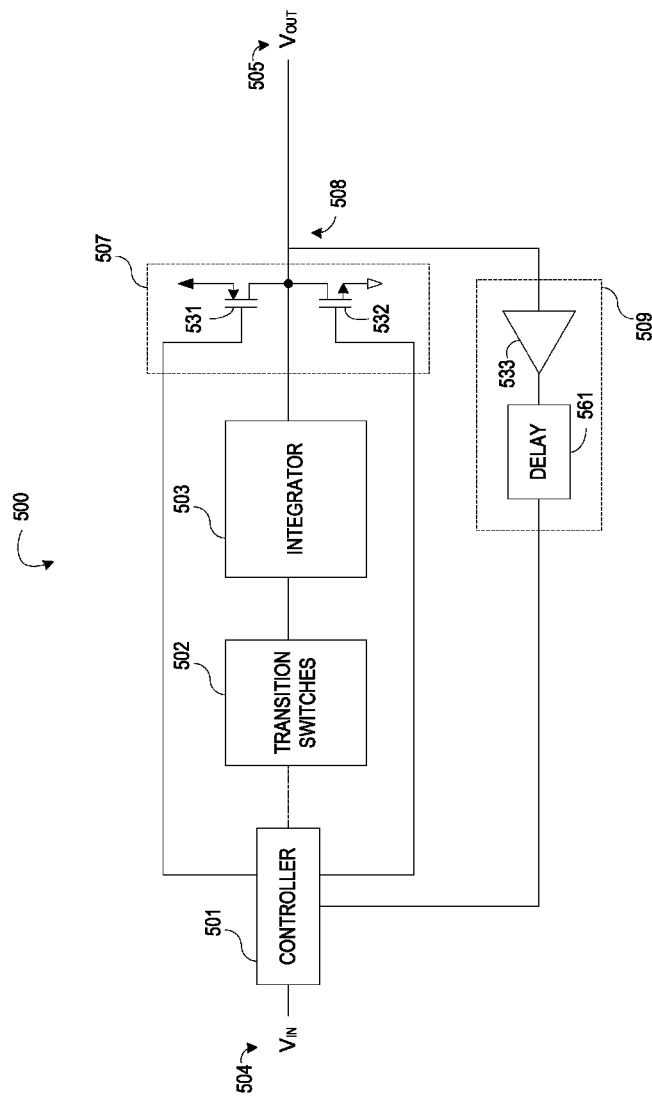

FIG. 5 illustrates generally an example of an edge rate control apparatus 500 including a controller 501, transition switches 502, an integrator 503, and stead-state switches 507. As similarly discussed above, the controller 501 can receive a switched input signal ($V_{IN}$) 504 and can generate an edge rate controlled, output signal 505 representative of the switched input signal 504 to reduce EMI. The controller 501 can initiate and control the transitions of the edge rate controlled, output signal 505 using the transition switches 502 and the integrator 503.

In an example, as the controller 501 detects a transition of the edge rate controlled, output signal 505 approaching or reaching an upper steady-state level, the controller 501 can trigger a first steady-state switch 531 to pull the voltage of the output 508 of the apparatus 500 to the upper steady state voltage level. In an example, as the controller 501 detects a transition of the edge rate controlled, output signal 505 approaching, or reaching, a lower steady-state level, the controller 501 can trigger a second steady-state switch 532 to pull the voltage of the output 508 of the apparatus 500 to the lower steady state voltage level. In an example, the first steady-state switch 531 can include a PMOS transistor and the second steady-state switch 532 can include an NMOS transistor. It is understood that other types of steady state switches are possible without departing from the scope of the present subject matter.

In an example, the edge rate control apparatus 500 configured to control the edge rate of a binary signal can employ a first steady-state switch 531 to pull the output to a first steady state level, and can employ a second steady state switch 532 to pull the output to a second steady state level. In certain examples, a delay circuit 509 can monitor the edge rate controlled, output signal 508 of the edge rate control apparatus 500 and trigger a delay device 561 as the edge rate controlled, output signal 508 transitions through a certain voltage level between the first and second steady state levels. A delay interval of the delay device 561 can be set such that the edge rate controlled, output signal 508 can be automatically pulled to an appropriate steady state level at approximately the expected time the transition of the edge rate controlled, output signal 508 should complete. For example, for a signal that transitions between 0 and $V_{dd}$, a buffer 533 (e.g., a CMOS buffer, etc.) having a threshold voltage ($V_{th}$) (e.g., of Vdd/2, etc.) can provide a switched output as the edge rate controlled, output signal 508 crosses the voltage half-way between 0 and $V_{dd}$. In such an example, the buffer 533 of the delay circuit can act as a comparator to trigger the delay element 561. The switched output of the buffer 533 can trigger the delay element 561. The expiration of the delay interval of the delay element 561 can be used to automatically switch the appropriate steady state switch 531, 532. For example, if the integrator and related components are selected to complete a transition between 0 and Vdd in about 20nsec, delay element 561 having 10nsec of delay can be selected to anticipate the end of a transition and the operation of an appropriate steady state switch 531, 532, assuming the inverter delay is substantially less than 10 nsec. In addition to allowing reduction in the on-resistance of the output of the integrator 503, the steady state switches 531, 532 can allow the controller 501 to to disable the integrator 503 between transition events, thus saving energy that would otherwise be consumed, at least in part, by the saturated integrator 503. It is understood that other types of buffers, comparators, or other delay intervals are possible without departing from the scope of the present subject matter.

Figure 6:
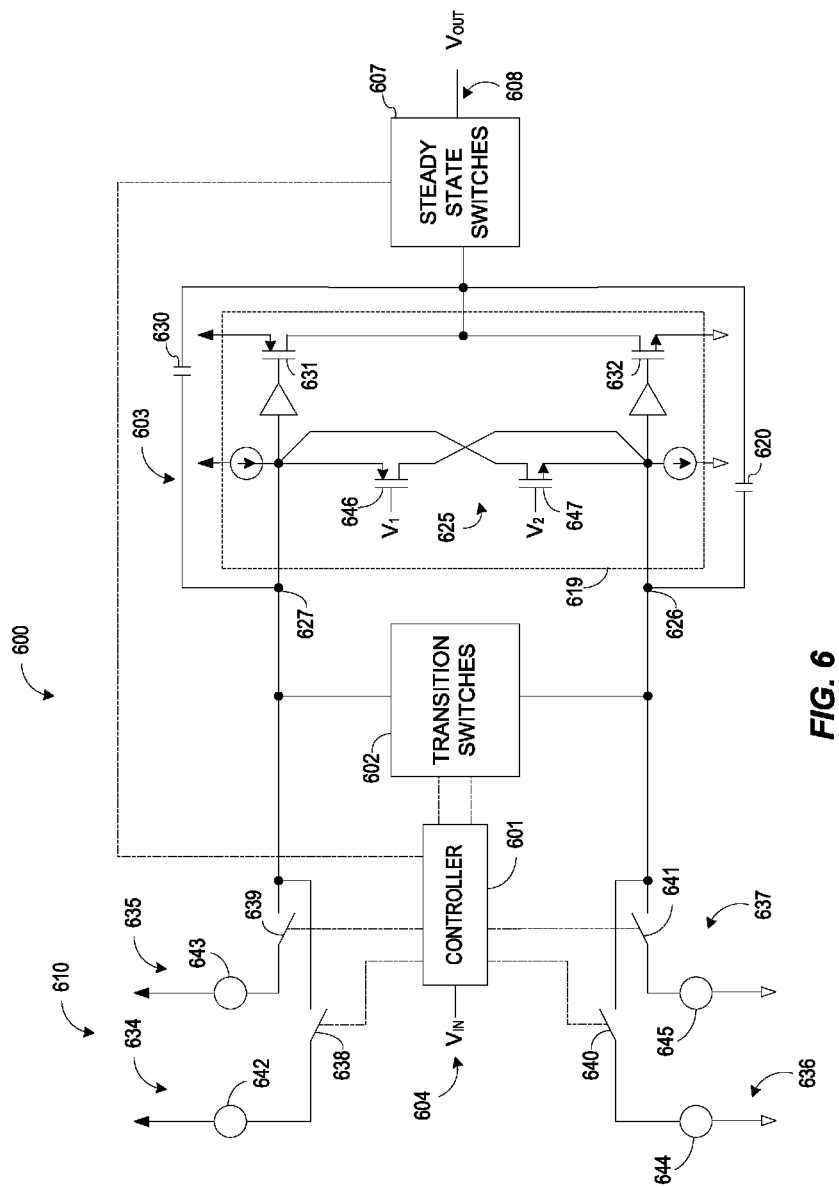

FIG. 6 illustrates generally an example of an edge rate control apparatus 600 including a controller 601, transition switches 602, an integrator 603 including an amplifier 619 and first and second capacitors 620, 630, steady state switches 607, and pre-bias switches 610. In an example, while the steady state switches 607 are maintaining the output 608 ($V_{OUT}$) at a steady-state signal level, the controller 601 can pre-bias the integrator inputs 626, 627 in anticipation of a subsequent transition of the output 608 in response to the switched input signal 604 ($V_{IN}$). For example, consider the switched input signal 604 that can make transitions between two steady state signal levels. While the steady state switches 607 maintain the output 608 at a first steady state signal level, the controller 601 can pre-bias the integrator inputs 626, 627 in preparation for a transition to the second steady state signal level.

In an example, the pre-bias switches 610 can include two switch circuits 634, 635, 636, 637 for each integrator input 626, 627. Each switch circuit 634, 635, 636, 637 can include a switch 638, 639, 640, 641 and a voltage source 642, 643, 644, 645. Each switch 638, 639, 640, 641 can selectively couple a respective voltage source 642, 643, 644, 645 to the integrator inputs 626, 627. In an example, a first pre-bias voltage source 642 can be approximately $2V_{th}$ of the first output transistor 631, a second pre-bias voltage source 643 can be approximately $0.5V_{th}$ of the first output transistor 631, a third pre-bias voltage source 644 can be approximately $2V_{th}$ of the second output transistor 632, and a fourth pre-bias voltage source 645 can be approximately $0.5V_{th}$ of the second output transistor 632. When a first switch of the steady-state switches 607 is pulling the output 608 to a low steady-state level, the first and fourth pre-bias switches 638, 641 can be open, and the second and third pre-bias switches 639, 640 can be closed. The closed pre-bias switches 639, 640 can hold the output transistors 631, 632 closer to the anticipated conduction state needed for the next transition of the output 508, thus, reducing pre-bias delays associated with switching the control nodes of the output transistors 531, 532. If a switch of the steady state switches is pulling the output to a high steady state level, the first and fourth pre-bias switches 638, 641 can be closed, and the second and third pre-bias switches 639, 640 can be open. The closed pre-bias switches 638, 641 can hold the output transistors 631, 632 closer to the anticipated conduction state needed for the next transition of the output 508 from a high steady state level to a low steady state level.

In the example of FIG. 6, the integrator 603 includes details of an example level shift circuit 625. The level shift circuit 625 includes first and second level shift transistors 646, 647, each coupled between summing nodes 626, 627 of the amplifier 619. The level shift circuit 625 can provide a constant bias between the control nodes of the output transistors 631, 632 to compensate for the threshold voltage ($V_{th}$) of each output transistor 631, 632 and to provide a smooth transition between the conduction states of the amplifiers 631, 632. A voltage $V_1$, $V_2$, applied to each of the control gates of the level shift transistors 646, 647 can provide the constant bias between the summing nodes 626, 627. As the voltage at a summing node varies, the level shift transistors 646, 647 maintain the constant bias between the summing nodes 626, 627. For example, as the voltage at the lower summing node 626 increases, the level shift circuit 625 can maintain the bias voltage between the summing nodes 626, 627 resulting in an increase of the voltage at the upper summing node 627. As a result, upon an increase of voltage at the lower summing node 626, the second output transistor 632 can increase conduction and the first output transistor 632 can decrease conduction. Consequently, the voltage at the output 608 can be pulled lower.

Figure 7:
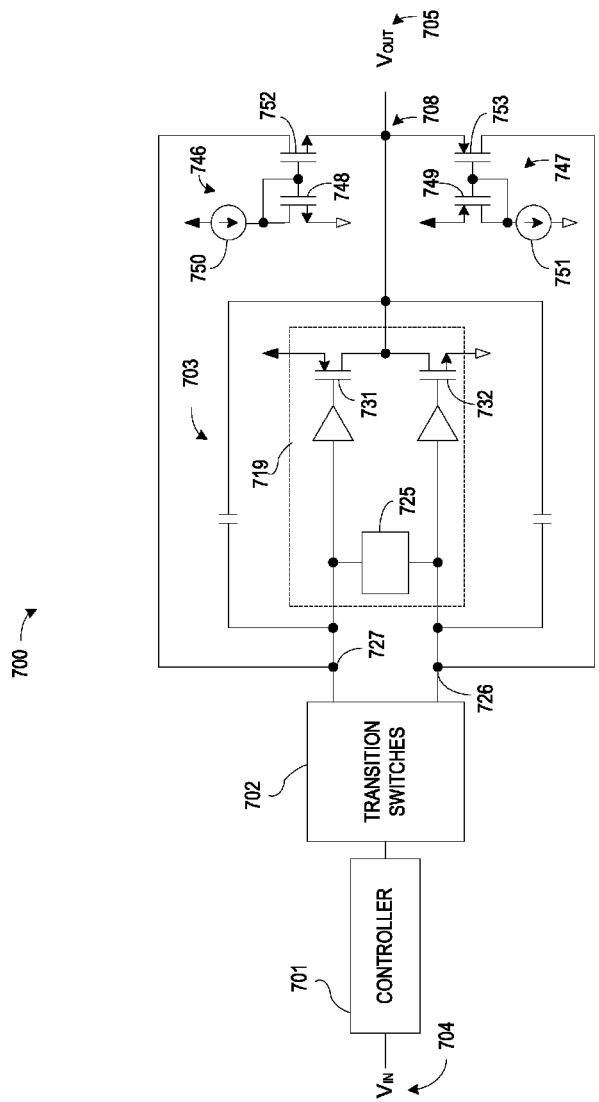

FIG. 7 illustrates generally an example of an edge rate control apparatus 700 including a controller 701, transition switches 702, an integrator 703, and an overshoot limiters 746. 747. As similarly discussed above, the controller 701 can receive a switched input signal 704 ($V_{IN}$) and can generate an edge rate controlled, output signal 705 ($V_{OUT}$) representative of the switched input signal 704 to reduce EMI. The controller 701 can initiate and control the transitions of the edge rate controlled, output signal 705 using the transition switches 702 and the integrator 703. Inertial current in a load (not shown), such as an inductive load, can cause the voltage at the output 708 of the edge rate control apparatus 700 to overshoot an intended steady state voltage level. Inertial currents can have a wide range of magnitudes and can be flowing in either direction at the output 708 when a transition occurs. In some situations, excessive overshoot can cause conduction in the body diodes of the amplifier output transistors 731, 732 as well as steady state switch transistors, if employed. The overshoot limiters 746, 747 can limit each direction of transition overshoot. Each overshoot limiter 746, 747 can include a bias transistor 748, 749, a bias current source, 750, 751, and a sense transistor 752, 753. The bias transistor, 748, 749 and bias current source 750, 751 can maintain a bias on the sense transistor 752, 753 such that, as a voltage at the output 708 over shoots an intended steady state level, the sense transistor 752, 753 can turn on and adjust a voltage at a summing node 726, 727 of an amplifier 719 of the integrator 703 to drive the output transistor 731, 732 of the integrator 703 to resist the overshoot. For example, if the voltage of the output 708 were to fall below the lower steady state level, a biased, sense transistor 752 of the first limiter 746 can begin to conduct current into the upper summing node 727 of the integrator 703. The injected current can lower the voltage of the summing node 727 and can cause the first output transistor 731 to conduct, or conduct harder, to resist the voltage drop. At the same time, the level shift circuit 725 can lower the voltage of the lower summing node 726 causing the second output transistor 732 to turn off, or to increase its drain-source resistance, thus not pulling the output 708 as hard to the lower steady-state level. If the voltage at the output 708 were to rise above the upper steady-state level, the biased sense transistor 753 of the second limiter 747 can conduct current into the lower summing node 726 of the integrator 703. The injected current can raise the voltage of the lower summing node 726 and can cause the second output transistor 732 to conduct or conduct harder, to resist the voltage rise. At the same time, the level shift circuit 725 can raise the voltage at the control node of the first output transistor 732, raising the source-drain resistance, thus reducing the influence of the first output transistor 732 in pulling the output toward the steady state level.

Figure 8:
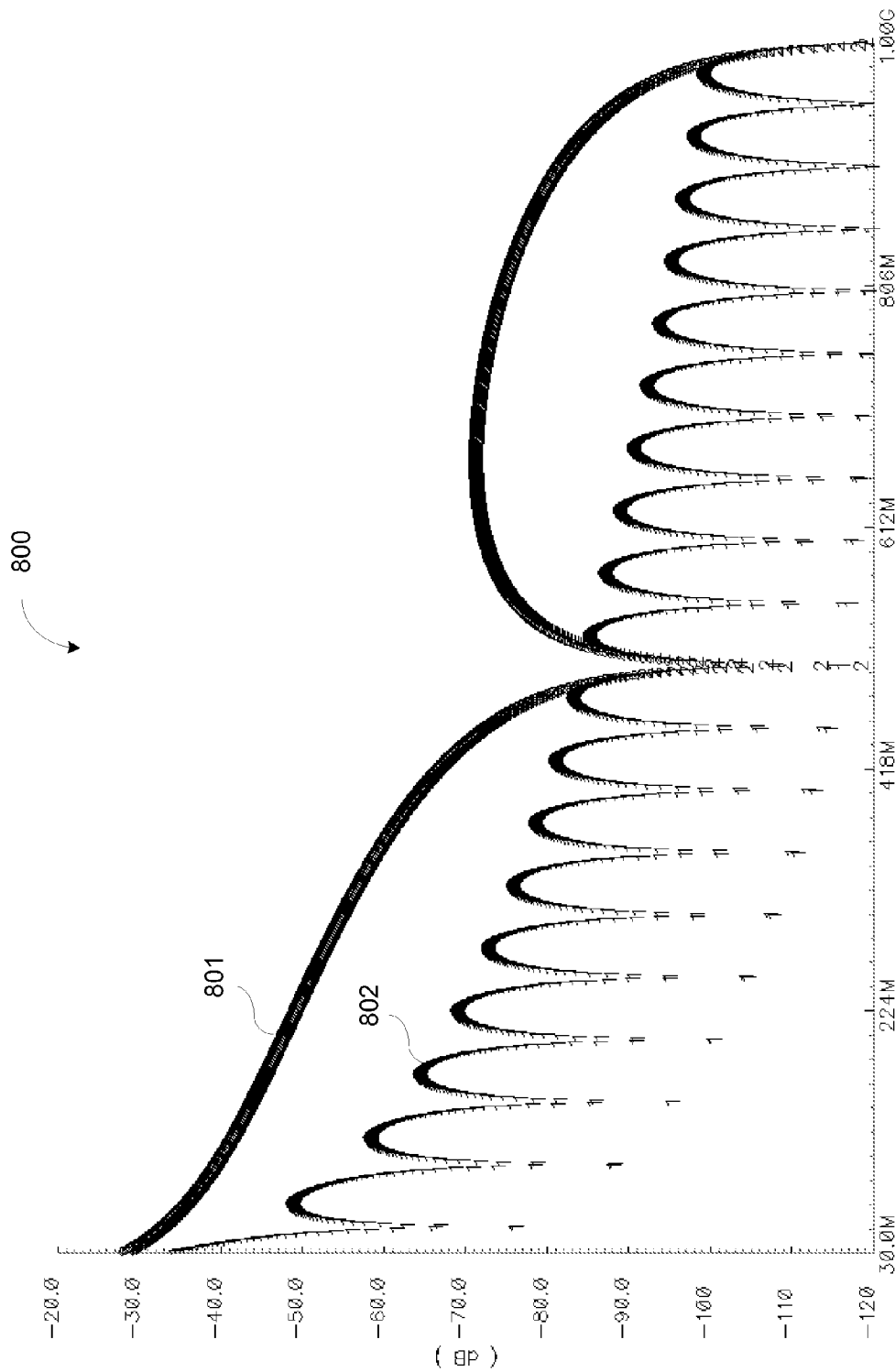
FIG. 8 illustrates generally an example of a graphic comparison of potential EMI signal strength between a switch signal and an edge rate controlled, switched signal.

FIG. 8 illustrates generally an example of a graphic comparison 800 of potential EMI signal strength between a switch signal having a 2 nsec transition time 801 and an edge rate controlled, switched signal having a 20 nsec transition time 802. The graphic comparison 800 shows a frequency domain view of the signals. The graphic comparison 800 also shows an average reduction of signal strength across the displayed frequency range of about 10-15 db for the signal with the 20 nsec transition time.

Figure 9:
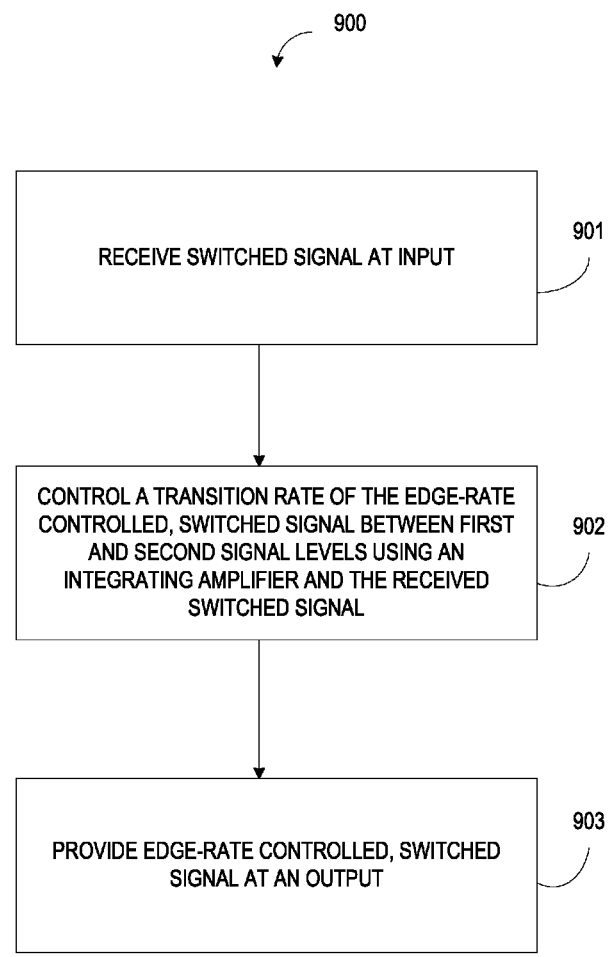
FIG. 9 illustrates generally an example of a method for providing an edge rate controlled switched signal representative of a received switched input signal according to an example of the present subject matter.

FIG. 9 illustrates generally an example of a method for providing an edge rate controlled switched signal representative of a received switched input signal according to an example of the present subject matter. At 901, a switched signal can be received at an input of an apparatus. At 902, a transition rate of an edge rate controlled switched signal can be controlled between first and second signal levels using an integrating amplifier and the received switched input signal. At 903, the edge rate controlled, switched signal can be provided at an output.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although the examples above have been described relating to PNP devices, one or more examples can be applicable to NPN devices. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus for reducing electro-magnetic interference, the apparatus comprising:
   an input configured to receive a switched input signal;
   an output configured to provide an edge rate controlled, switched output signal corresponding to the received switched input signal;
   a controller responsive to the received switched input signal, the controller including:
      an integrating amplifier configured to control a transition rate of the edge rate controlled, switched output signal between first and second signal levels, and
      wherein the integrating amplifier includes:
         a first amplifier having a first input node and an output node coupled to the output; and
         a first capacitor coupled between the first input node and the output node of the amplifier,
   wherein the controller includes a first selection circuit configured to selectively couple first and second current sources to the first input node of the amplifier to set the transition rate of the edge rate controlled, switched output signal between the first and second signal levels; and
   wherein the first amplifier includes complementary first and second output transistors coupled in series between a supply node and a reference node, the output node including a node configured to couple the first output transistor in series with the second output transistor.

2. The apparatus of claim 1, wherein the amplifier includes first and second buffers configured to isolate a capacitance of the first and second output transistors from the input node;
   wherein the first buffer is coupled between the first input node and a control node of the first output transistor; and wherein the second buffer is coupled between the first input node and a control node of the second output transistor.

3. The apparatus of claim 2, including a level shifter coupled between an input of the first buffer and an input of the second buffer.

4. The apparatus of claim 2, wherein the amplifier includes a second input node coupled to the input of the second buffer;
wherein the integrating amplifier includes a second capacitor coupled between the second input node and the output node of the amplifier; and
wherein the controller includes a second selection circuit configured to selectively couple third and fourth current sources to the second input node of the amplifier to set the transition rate of the edge rate controlled, switched signal between the first and second signal levels.

5. The apparatus of claim 4, including:
a delay circuit coupled to the output and configured to provide a delay control signal;
a first bypass switch configured to couple the output to a first reference voltage using the delay control signal; and
a second bypass switch configured to couple the output to a second reference voltage using the delay control signal.

6. The apparatus of claim 5, including a voltage tie-off circuit configured to reduce a response time of the integrating amplifier in response to a transition of the received switched input signal between first and second signal levels, the voltage tie-off circuit including:
a first voltage source selectively coupled to the first input node when the output is at a first signal level; and
a second voltage source selectively coupled to the first input node when the output is at a second signal level.

7. The apparatus of claim 1, including an overshoot limiter coupled to the output and configured to exchange current with a load coupled to the output to reduce voltage overshoot as a voltage of the output reaches the first and second signal levels.

8. A method for reducing electro-magnetic interference, the method comprising:
receiving a switched input signal at an input;
controlling a transition rate of an edge rate controlled, switched output signal in response to the received switched input signal;
providing the edge rate controlled, switched output signal at an output;
wherein the controlling the transition rate includes controlling the transition rate of the edge rate controlled, switched output signal between first and second signal levels using an integrating amplifier;
selectively coupling the output to a first voltage source after a transition from the second signal level to the first signal level;
selectively coupling the output to a second voltage source after a transition from the first signal level to the second signal level; and
wherein the controlling the transition rate includes:
detecting an signal level of the output between the first signal level and the second signal level using a comparator coupled to the output;
initiating a delay using a delay element coupled to the comparator;
selectively coupling the output to at least one of a first or second voltage source in response to an expiration of the delay; and
disabling the integrating amplifier.

9. An apparatus for reducing electro-magnetic interference, the apparatus comprising:
an input configured to receive a switched input signal;
an output configured to provide an edge rate controlled, switched output signal corresponding to the received switched input signal;
a controller responsive to the received switched input signal, the controller including:
an integrating amplifier configured to control a transition rate of the edge rate controlled, switched output signal between first and second signal levels, and
wherein the integrating amplifier includes:
a first amplifier having a first input node and an output node coupled to the output; and
a first capacitor coupled between the first input node and the output node of the amplifier, and
wherein the controller includes a first selection circuit configured to selectively couple first and second current sources to the first input node of the amplifier to set the transition rate of the edge rate controlled, switched output signal between the first and second signal levels; and
wherein the apparatus includes:
a delay circuit coupled to the output and configured to provide a delay control signal;
a first bypass switch configured to couple the output to a first reference voltage using the delay control signal; and
a second bypass switch configured to couple the output to a second reference voltage using the delay control signal.

10. The apparatus of claim 9, including an overshoot limiter coupled to the output and configured to exchange current with a load coupled to the output to reduce voltage overshoot as a voltage of the output reaches the first and second signal levels.

11. The apparatus of claim 9, wherein the delay circuit includes:
a comparator configured to detect an output signal level between the first signal level and the second signal level; and
a delay element coupled to an output of the comparator and configured to switch the delay control signal a predetermined delay interval after the comparator detects the output signal level between the first signal level and the second signal level.

12. The apparatus of claim 11, wherein the comparator is configured to detect an output signal level substantially midway between the first signal level and the second signal level.

13. The apparatus of claim 12, wherein the predetermined delay interval is about 10 nanoseconds.

14. An apparatus for reducing electro-magnetic interference, the apparatus comprising:
an input configured to receive a switched input signal;
an output configured to provide an edge rate controlled, switched output signal corresponding to the received switched input signal;
a controller responsive to the received switched input signal, the controller including:
an integrating amplifier configured to control a transition rate of the edge rate controlled, switched output signal between first and second signal levels, and
wherein the integrating amplifier includes:
a first amplifier having a first input node and an output node coupled to the output; and
a first capacitor coupled between the first input node and the output node of the amplifier;
an overshoot limiter coupled to the output and configured to exchange current with a load coupled to the output to reduce voltage overshoot as a voltage of the output reaches the first and second signal levels; and wherein the controller includes a first selection circuit configured to selectively couple first and second current sources to the first input node of the amplifier to set the transition rate of the edge rate controlled, switched output signal between the first and second signal levels.

15. A method for reducing electro-magnetic interference, the method comprising:

receiving a switched input signal at an input;

controlling a transition rate of an edge rate controlled, switched output signal in response to the received switched input signal;

providing the edge rate controlled, switched output signal at an output;

wherein the controlling the transition rate includes controlling the transition rate of the edge rate controlled, switched output signal between first and second signal levels using an integrating amplifier;

selectively coupling the output to a first voltage source after a transition from the second signal level to the first signal level;

selectively coupling the output to a second voltage source after a transition from the first signal level to the second signal level; and wherein the controlling the transition rate includes:

coupling a first current source to a first input of the integrating amplifier to generate a first transition from the first signal level to the second signal level over a predetermined interval in response to a first transition of the received switched signal;

coupling a second current source to a first input of the integrating amplifier to generate a second transition from the second signal level to the first signal level over the predetermined interval in response to a second transition of the received switched signal;

coupling a third current source to a second input of the integrating amplifier to generate a first transition from the first signal level to the second signal level over a predetermined interval in response to a first transition of the received switched signal; and coupling a fourth current source to the second input of the integrating amplifier to generate a second transition from the second signal level to the first signal level over the predetermined interval in response to a second transition of the received switched signal.

* * * * *